United States Patent [19]
Farnworth

[11] Patent Number: 5,893,765
[45] Date of Patent: Apr. 13, 1999

[54] COMPLIANT CONTACT INTEGRATOR

[75] Inventor: Warren M. Farnworth, Nampa, Id.

[73] Assignee: Micron Technology, Inc., Boise, Id.

[21] Appl. No.: 08/791,039

[22] Filed: Jan. 29, 1997

[51] Int. Cl.[6] .................................................... H01R 4/58
[52] U.S. Cl. ........................................... 439/91; 439/66
[58] Field of Search ............................ 439/71, 91, 66, 439/485

[56] References Cited

U.S. PATENT DOCUMENTS

| | | | |
|---|---|---|---|
| 5,073,117 | 12/1991 | Malhi et al. | 439/71 |
| 5,155,905 | 10/1992 | Miller, Jr. | 439/66 |
| 5,171,290 | 12/1992 | Olla et al. | 439/66 |
| 5,249,450 | 10/1993 | Wood et al. | 72/359 |
| 5,282,111 | 1/1994 | Hopfer | 439/485 |
| 5,367,253 | 11/1994 | Wood et al. | 324/158.1 |
| 5,473,510 | 12/1995 | Dozier, II | 439/66 |
| 5,483,174 | 1/1996 | Hembree et al. | 324/765 |
| 5,636,996 | 6/1997 | Johnson et al. | 439/66 |

Primary Examiner—Neil Abrams
Assistant Examiner—Katrina Davis
Attorney, Agent, or Firm—Fletcher, Yoder & Van Someren

[57] ABSTRACT

A contact integrator for supporting a die in a semiconductor package and for providing an electrical pathway from the semiconductor package to one or more bonding pads on the die is provided. The contact integrator includes a substrate that has one or more conductor trace for interconnection to the semiconductor package. A Z-elastomer member is disposed on the substrate. An insulating member is disposed on the Z-elastomer member. One or more conductor rods are coupled to the insulating member. Each of the conductor rods has a first end adapted to contact one of the bonding pads and a second end adapted to contact the Z-elastomer member. The conductor rods are respectively substantially vertically aligned with the bonding pads and the conductor traces, and are capable of longitudinal movement relative to the insulating member.

29 Claims, 5 Drawing Sheets

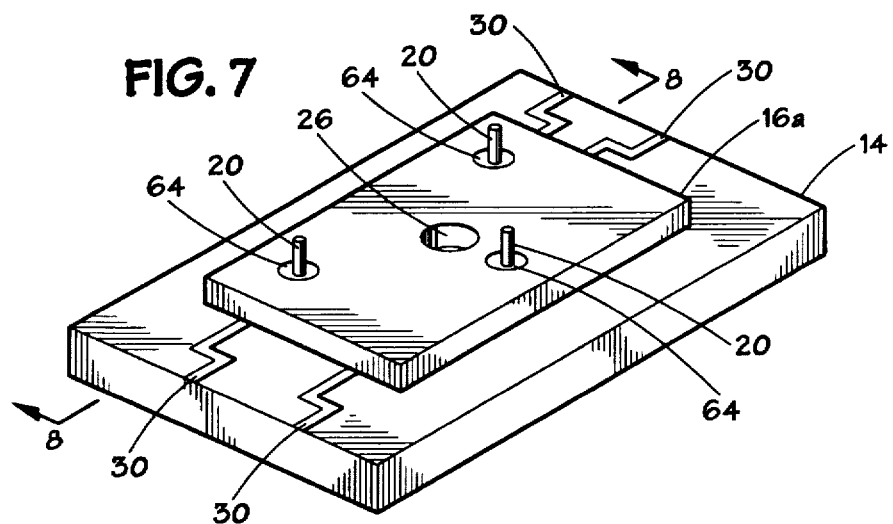
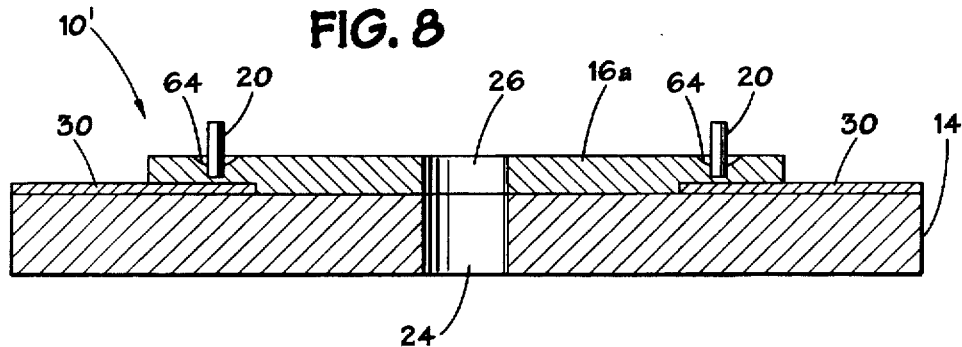
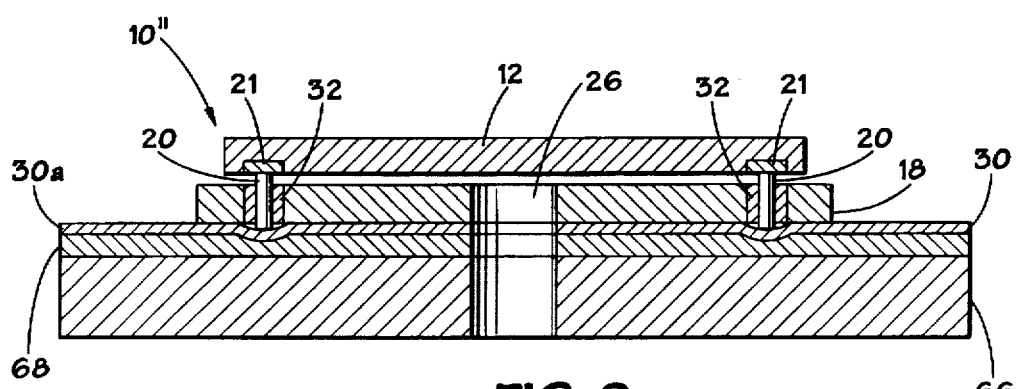

COMPLIANT CONTACT INTEGRATOR

BACKGROUND OF THE INVENTION

1. Field of Invention

This invention relates generally to semiconductor device packaging and more specifically to a compliant contact integrator for securing a bare semiconductor die and method for making same.

2. Description of the Related Art

In the manufacture of unpackaged semiconductor die it is often desirable to establish electrical connections between the bonding pads of the die and other electrical devices for testing or other purposes. For example, burn-in and full functionality tests are typically performed to certify each bare die as a known good die (KGD). During these test procedures, the bare die are loaded into a test carrier, which takes the place of a conventional plastic or ceramic semiconductor package. A typical test carrier consists of a die cavity plate that has a die cavity formed therein and a plurality of pins that extend from the die cavity plate for connection to test apparatus. The configuration of such a die cavity plate is similar to a standard ceramic dual in-line package (CERDIP). Prior to testing, a bare die is inserted into the die cavity and temporarily connected to communicate electrically with the external pins of the die cavity plate.

The die cavity plate is then connected to a particular test apparatus. These types of test apparatus typically include an interconnect component for establishing the temporary ohmic connection between the bare die and the pins of the test carrier. One example of such an interconnect component known in the art utilizes an interconnect formed on a silicon substrate with integrally formed silicon contact members. The integrally formed contact members are positioned and configured to contact the individual contact pads on the die, and the ultimate ohmic connection with the pins of the test carrier is made via bonding wires. Another type of interconnect component known in the art incorporates microbump contact members. The microbump contact members consist of metal bumps formed on conductor traces that are attached to an insulative film, such as polyimide. The microbumps are configured and spaced to make electrical contact with the bonding pads of the bare die. The conductor traces are adapted to establish a circuit path to the microbumps. The conductor traces are ordinarily electrically connected to the external pins of the test carrier via bonding wires. For forming the interconnect component, the combination of the insulative film with the microbumps and conductor traces attached thereto can be mounted to a rigid substrate.

There are certain disadvantages associated with each of the aforementioned interconnect components. The interconnect component formed on a silicon substrate with integrally formed silicon contact members requires complex, time-consuming, and costly semiconductor device fabrication techniques. The manufacturing process for the microbump interconnect component is similarly complicated and costly. In the typical process flow, the conductive traces are formed by electroplating a patterned metal layer on the insulating film or by laminating a layer of metal to the insulating film and, then, etching the metal layer to form the conductor traces. In either case, a masking step is required to outline the pattern for the conductor traces. After the conductor traces are formed, holes or vias are established in the insulating film and metal is electroplated into the vias to form the microbumps.

The present invention is directed to overcoming, or at least reducing the effects of, one or more of the aforementioned disadvantages.

SUMMARY OF THE INVENTION

In accordance with one aspect of the present invention, a contact integrator for supporting a die in a semiconductor package and for providing an electrical pathway from the semiconductor package to a conducting region on the die is provided. The contact integrator includes a substrate that has a conductor member coupled thereto. The conductor member is adapted to be electrically connected to the semiconductor package. A Z-elastomer member is disposed on the substrate. Three conductor rods are coupled to the Z-elastomer member. Each of the conductor rods has a first end for contacting and supporting the die and a second end coupled to the Z-elastomer member.

In accordance with another aspect of the present invention, a contact integrator for supporting a die in a semiconductor package and for providing an electrical pathway from the semiconductor package to a conducting region on the die is provided. The contact integrator includes a substrate that has a conductor member adapted to be electrically connected to the semiconductor package. An insulating member is disposed on the substrate. A conductor rod is coupled to the insulating member. The conductor rod is capable of longitudinal movement relative to the insulating member. The conductor rod has a first end adapted to contact the conducting region and a second end adapted to contact the conductor member. The conductor rod is substantially vertically aligned with the conducting region and the conductor member.

In accordance with still another aspect of the present invention, an apparatus for encasing a bare die and for providing an electrical pathway from a conducting region on the die is provided. The system includes a semiconductor package that has a conducting pin extending therefrom and an internal cavity. A substrate is disposed in the internal cavity. The substrate has a conductor member coupled thereto that is adapted to be electrically connected to the semiconductor package. A Z-elastomer member is disposed on the substrate. An insulating member is disposed on the Z-elastomer member. A conductor rod is coupled to the insulating member. The conductor rod has a first end adapted to contact the conducting region and a second end adapted to contact the Z-elastomer member. The conductor rod is substantially vertically aligned with the conducting region and the conductor member and is capable of longitudinal movement relative to the insulating member.

In accordance with yet a further aspect of the present invention, a method is provided of integrating a bare die into a semiconductor package that has an internal cavity and where the bare die has a conducting region. The method includes the steps of providing a substrate in the internal cavity. The substrate has a conductor member coupled thereto that is adapted to be electrically connected to the semiconductor package. An insulating member is placed on the substrate. A conductor rod is coupled to the insulating member. The conductor rod is capable of longitudinal movement relative to the insulating member and has a first end adapted to contact the conducting region and a second end adapted to contact the conductor member. The conductor rod is substantially vertically aligned with the conducting region and the conductor member. The die is placed on the insulating member such that the conducting region contacts the conductor rod.

BRIEF DESCRIPTION OF THE DRAWINGS

Other objects and advantages of the invention will become apparent upon reading the following detailed description and upon reference to the drawings in which:

FIG. 7 is an isometric pictorial view of an alternate embodiment of a compliant contact integrator constructed in accordance with the present invention;

FIG. 8 is a cross-sectional view of FIG. 7 taken at section 8—8; and

FIG. 9 is a cross-sectional view of another alternate embodiment of a compliant contact integrator constructed in accordance with the present invention.

DETAILED DESCRIPTION OF SPECIFIC EMBODIMENTS

Figure 1:
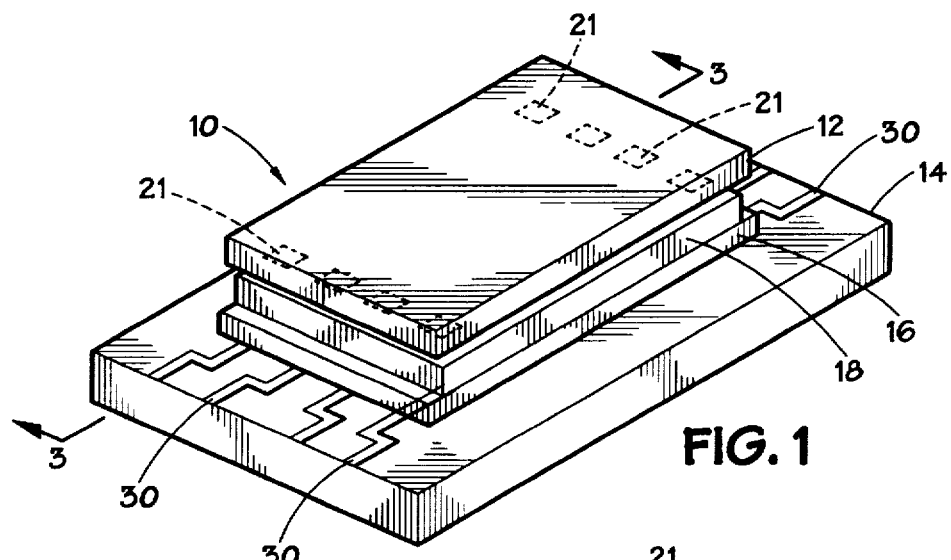
FIG. 1 is an isometric pictorial view of a compliant contact integrator constructed in accordance with the present invention.

Referring now to the figures, and particularly to FIGS. 1–3, there is shown an exemplary embodiment of a compliant contact integrator 10 that is adapted to facilitate placement and electrical connection of a bare die 12 in a semiconductor package (shown in FIGS. 4–6 and discussed below). The compliant contact integrator 10 includes a relatively rigid insulating substrate 14, a selectively conducting Z-elastomer member 16, and a sheet of insulating material 18 assembled into a stack suitable for placement in a semiconductor package as discussed below. The die 12 is supported above the insulating sheet 18 by a plurality of vertically disposed cylindrical contact rods 20. Note that the die 12 has a number of conducting regions or bonding pads 21 (shown in phantom in FIGS. 1–2) spaced about the perimeter of the die 12. The contact rods 20 are respectively disposed in a corresponding plurality of holes or vias 22 extending vertically through the insulating sheet 18. As shown in FIG. 3, which is a cross-sectional view of FIG. 1 taken at section line 3—3, the contact rods 20 are aligned to contact the bonding pads 21 and the Z-elastomer member 16.

The substrate 14 has a size and peripheral outline that generally correspond to the peripheral outline of the semiconductor die 12, though with a proportionately larger upper surface area than the die 12, to provide for electrical interconnection with a semiconductor package as discussed more below. The substrate 14 is advantageously formed of a material that has a coefficient of thermal expansion (CTE) that approximates the CTE of the silicon die 12. In this embodiment, materials for the substrate 14 may include silicon, silicon-on-sapphire, silicon-on-glass, germanium and ceramic materials. Glass-filled plastics, e.g. (FR-4) and metals may also be used to form the substrate 14. The substrate 14 may be about 4 to 30 mils thick and is advantageously about 28.5 mils thick.

The substrate 14 includes a centrally located passage 24. There are similarly located and sized passages 26 and 28, respectively, in the Z-elastomer member 16 and the insulating sheet 18. When the substrate 14, the Z-elastomer member 16, and the insulating sheet 18 are assembled into a stack as shown in FIGS. 1 and 3, the passages 24, 26 and 28 are aligned to form a conduit. A vacuum source (not shown) may then be attached to the lower end of the passage 24 to urge the die 12 to seat snugly against the conductor rods 20 and the insulating sheet 18 during assembly.

To provide an electrical pathway from the conductor rods 20, one or more conductor members or traces 30 are formed on the upper surface of the substrate 14. The conductor traces 30 are composed of a conductive metal such as aluminum, copper, nickel or alloys thereof. The conductor traces 30 may be formed from a metal layer that is deposited on the substrate 14 and then patterned. For example, the conductor traces 30 may be electroplated to the substrate 14 through a mask. Alternatively, the conductor traces 30 may be created by laminating a metal layer to the substrate 14 by molding or other process, followed by a wet or a dry etch of the metal laminate to form the conductor traces 30. Thin film formation may also be used to form the conductor traces 30 using deposition techniques such as chemical vapor deposition, followed by photolithography and etching. As noted above, the area of the upper surface of the substrate 14 is proportionately larger than the die 12 so that when the compliant contact integrator 10 is assembled, a sufficient amount of the conductor traces 30 proximate the ends of the substrate 14 are exposed to facilitate subsequent interconnection with bonding wires or other such connections when the compliant contact integrator 10 is placed in a semiconductor package.

The Z-elastomer member 16 is placed on top of the substrate 14. The Z-elastomer member 16 has a size and peripheral outline that generally correspond to the peripheral outline of the semiconductor die 12. Although the inherent tackiness of the Z-elastomer member 16 will generally hold the Z-elastomer member 16 in place, a Z-axis adhesive may also be used, such as Scotch 9703 double-sided tape, or an epoxy matrix with conducting particles supplied by Zymet, Inc. of East Hannover, N.J. The Z-elastomer member 16 may be about 4 to 20 mils thick and is advantageously about 10 mils thick.

The Z-elastomer member 16 provides a selectively conducting path between the conductor rods 20 and the conductor traces 30. It also provides a degree of compliance to reduce the stresses imparted on the die 12 by the conductor rods 20. To provide such a conducting path between the conductor rods 20 and the conductor traces 30 on the substrate 14, the Z-elastomer member 16 is advantageously composed of a Z-axis anisotropically conductive elastomeric material (otherwise known as a Z-elastomer). A Z-elastomer is selectively conductive along the Z-axis. The selectively conductive character is achieved by impregnating an elastomer matrix with a plurality of tiny conducting particles, such as gold coated polymer, glass, or nickel spheres. When the Z-elastomeric material is in an uncompressed state, the conducting particles are dispersed within the elastomeric material such that the Z-elastomer behaves like an insulating material. However, when a compressive force is applied to the Z-elastomeric material at a given point along a Z-axis, the dispersion of the conducting particles at that point will decrease, thereby forming a path of conductive material through which current may flow at that point along a Z-axis. However, the Z-elastomer retains dielectric properties along the X and Y axes. Exemplary Z-elastomers are manufactured by A.I. Technology, Inc., AT&T Corp. and Zebra Strip Corp.

As shown in FIGS. 1 and 3, the Z-elastomer member 16 is disposed on top of the substrate 14 so that a portion of each conductor trace 30 is in physical contact with the Z-elastomer member 16. When the compliant contact integrator 10 is assembled, and a vacuum is applied to the passages 24, 26, and 28, the die 12 is urged downward toward the substrate 14. As the die 12 moves downward, it contacts and moves the conductor rods 20 downward through the vias 22 until the lower ends of the conductor rods 20 depress into the Z-elastomer member 16. At the point where each conducting rod 20 depresses into the Z-elastomer member 16, a conducting path along the Z-axis is established through the Z-elastomer member 16. Since the conductor rods 20 are spatially aligned with their respective conductor traces 30, a conductive path is established from the bond pads 21 to each respective conductor trace 30.

The insulating sheet 18 is placed over the Z-elastomer member 16 and held in place by the inherent tackiness of the Z-elastomer member 16, or alternatively, by an adhesive, such as an epoxy, that may be applied between the Z-elastomer member 16 and the insulating sheet 18. The insulating sheet 18 functions to isolate the die 12 electrically from the Z-elastomer member 16 and to provide an alignment structure for placement of the conductor rods 20. The insulating sheet 18 is advantageously composed of a relatively rigid dielectric material, such as aluminum oxide. Other advantageous materials include chemical etchable glass, such as Foturan® by Schott Glass Technology of Duryea, Pa. The insulating sheet 18 may be about 5 to 45 mils thick and is advantageously about 10 mils thick.

The vias 22 in the insulating sheet 18 are formed in vertical alignment with the bonding pads 21 of the die 12. Each via 22 is provided with an elastomeric bushing 32 retains one of the conductor rods 20 therein and provides additional Z-axis compliance to accommodate for structural variations in the die 12. The elastomeric bushings 32 are advantageously composed of a silicone rubber that vulcanizes, such as Zymet TC-101 and Sumitomo KE1830. The vias 22 may be formed in the insulating sheet 18 by laser ablation, chemical etching, or mechanical punch-out. For example, an excimer laser having a laser fluence in the range of 250–350 mJ may be used to drill the vias 22. The vias 22 are advantageously formed with a diameter that is approximately twice that of the conductor rods 20 in order to accommodate the placement of the elastomeric bushings 32.

The conductor rods 20 are advantageously composed of a relatively low ductility conducting metallic material, such as nickel or a nickel alloy. Other materials include tungsten, titanium, chromium or vanadium. The conductor rods 20 are advantageously formed into cylindrical segments by cutting cold drawn wire. The ends of the rods 20 may be lapped flat or rounded by machining. The specific length and diameter of the conductor rods 20 will be a matter of discretion on the part of the designer. However, designers often limit the amount of bonding pad area that may be deformed by a contact member to approximately 40% of the bonding pad area. In this regard, the diameter of an exemplary conductor rod 20 with flat ends may be approximately 1 to 2.5 mils and is advantageously about 2 mils. The diameter of a conductor rod 20 with rounded ends may be approximately 1 to 5 mils and is advantageously about 2 mils. The conductor rods 20 should be longer than the thickness of the insulating sheet 18 so that when the compliant contact integrator 10 is assembled, the lower ends of the conductor rods 20 will depress into the Z-elastomer member 16 without bottoming out in the Z-elastomer member 16. In an exemplary embodiment, the conductor rods 20 should project approximately 2.5 to 5 mils above the insulating sheet 18 and may have a total length of approximately 9.5 to 65.5 mils.

Figure 2:
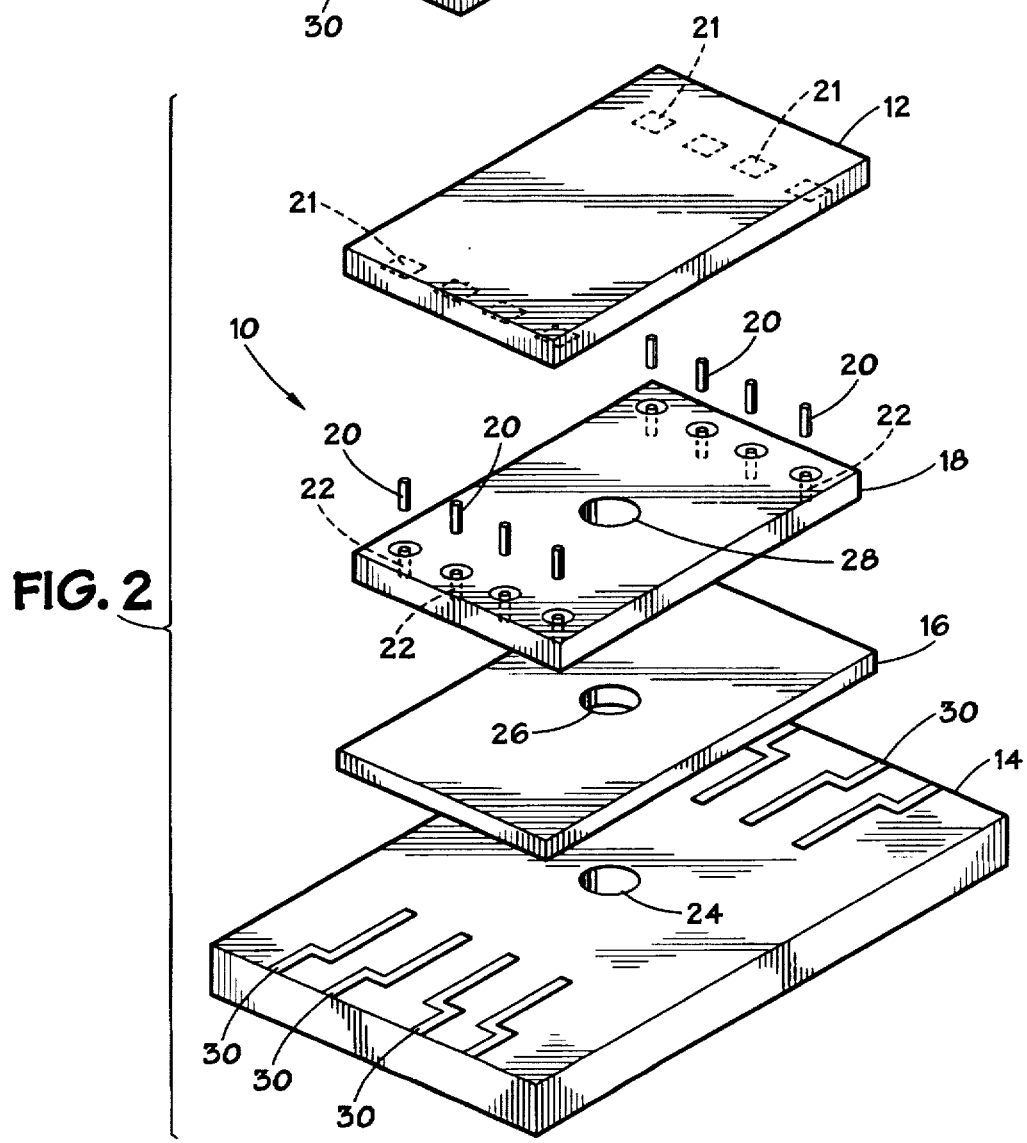
FIG. 2 is an exploded view of FIG. 1.
Figure 3:
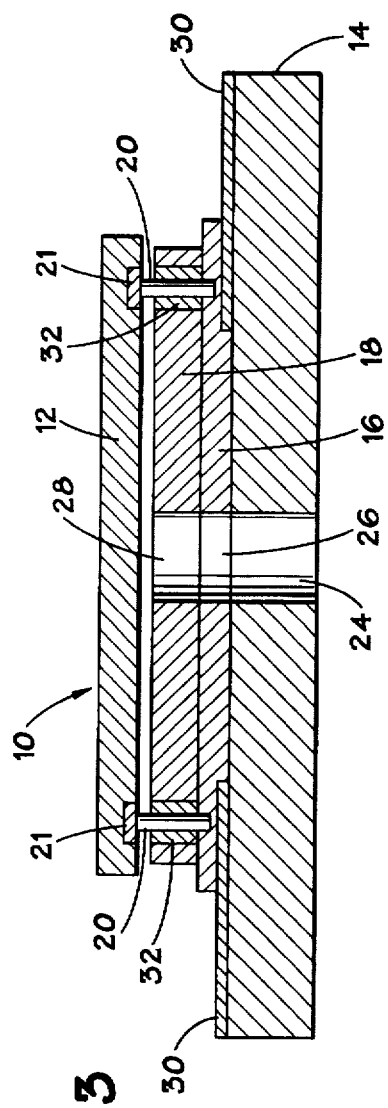
FIG. 3 is a cross-sectional view of FIG. 1 taken along section line 3—3.
Figure 4:
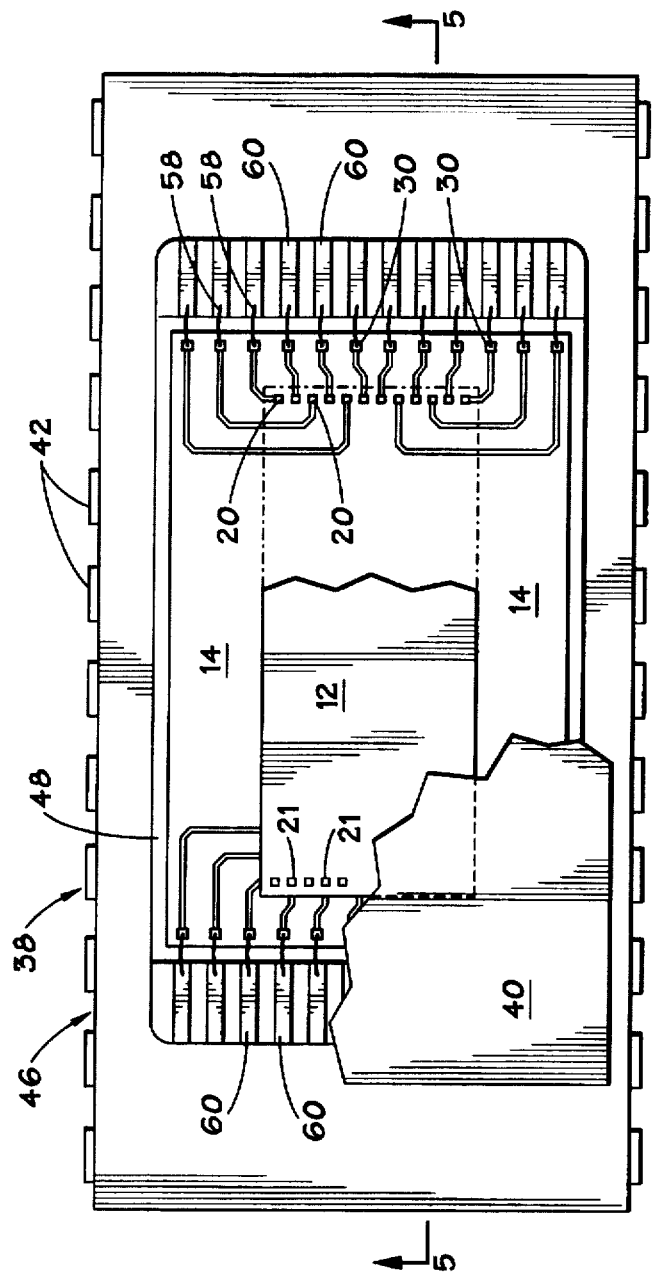
FIG. 4 is a plan view of the compliant contact integrator of FIG. 1 disposed in an exemplary semiconductor package, shown with the top of the package and a portion of an Z-elastomer member cut away to reveal the disposition of the compliant contact integrator.
Figure 5:
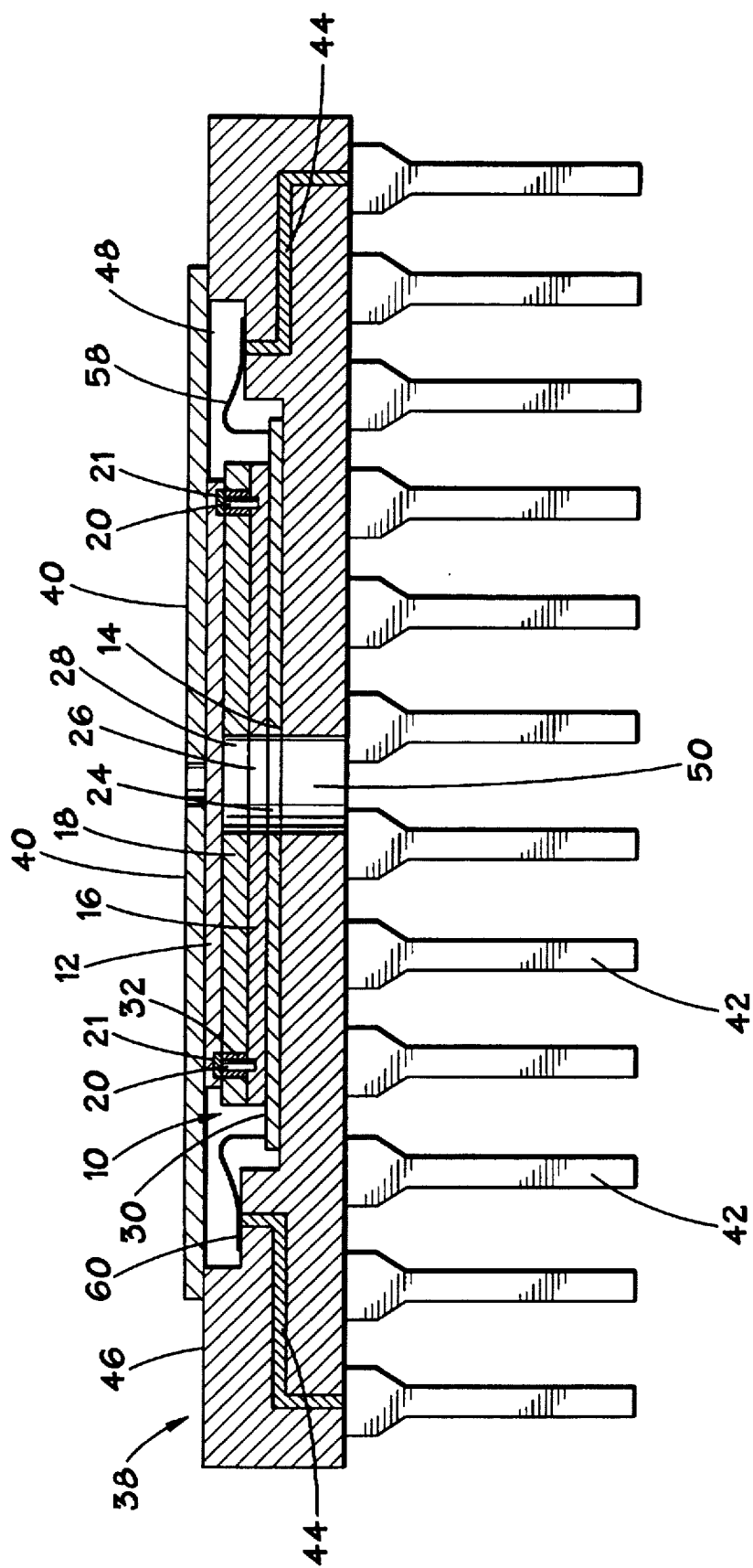
FIG. 5 is a cross-section view of FIG. 4 taken along section line 5—5, but with the portions of the cap and the Z-elastomer member cut away in FIG. 4 now shown.
Figure 6:
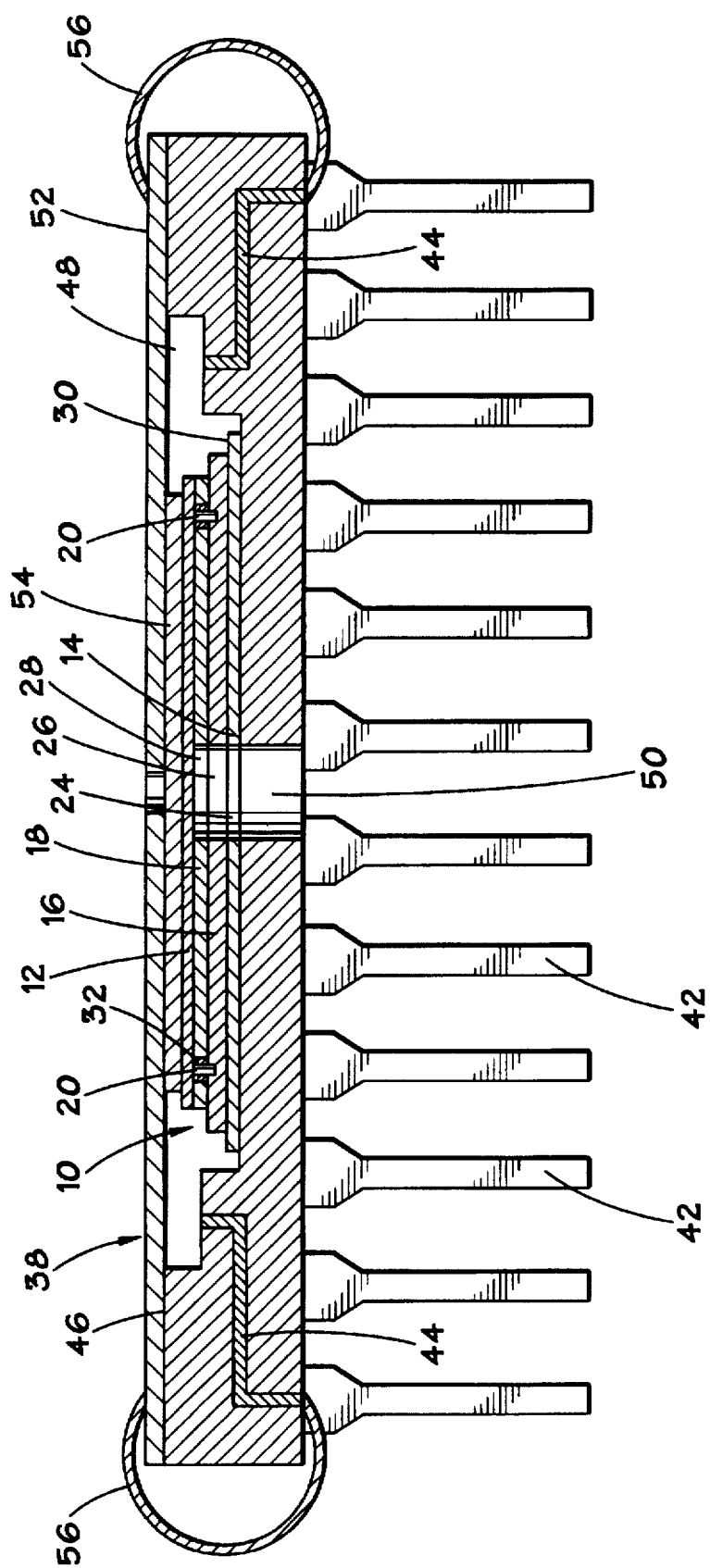
FIG. 6 is the cross-sectional view of FIG. 4 showing an intermediate stage of integration of the contact integrator into the semiconductor package.

The assembly and integration of the compliant contact integrator 10 into a semiconductor package may be understood by reference to FIGS. 1–6. FIG. 4 depicts a plan view of an exemplary semiconductor package 38 following complete integration of the contact integrator 10. FIG. 5 is a cross-sectional view of FIG. 4. FIG. 6 depicts a cross-sectional view of the package 38 prior to complete integration, and with a force distribution mechanism in place. The package 38 may be a test package or a package designed for permanent integration of the die 12. The semiconductor package 38 includes a lid 40, which is shown partially cut away to reveal the details of the interior of the package 38. As is evident from FIGS. 4 and 5, the semiconductor package 38 is adapted to be plugged into a circuit board socket via a plurality of pins 42 emanating from the bottom of the test package 38. An electrical path from the pins 42 is provided via a plurality of leads 44 formed in the body 46 of the package 38. The package body 46 is provided with an internal cavity 48 that is adapted to receive the die 12 and any supporting structure therefore. The package body 46 includes a vacuum passage 50 for facilitating the application of a vacuum to the structure supporting the die 12 within the cavity 48.

During the assembly and integration procedure, a suitable insulating adhesive (not shown), such as, for example, double-sided tape, is applied to the bottom of the cavity 48. The substrate 14 is placed on the adhesive. The Z-elastomer member 16 is placed on the substrate 14 so that a portion of each trace 30 that will carry current to or from the die 12 is covered by the Z-elastomer member 16. Next, the elastomeric bushings 32 and conductor rods 20 are installed in the insulating sheet 18, and the insulating sheet 18 is applied to the Z-elastomer member 16. The vias 22 must be carefully aligned with the traces 30 to ensure establishment of proper electrical pathways. This alignment may be accomplished using the optical alignment technique described in U.S. Pat. No. 5,483,174, the whole of which is incorporated herein by reference. The passages 24, 26, and 28 should also be substantially aligned. Following placement of the insulating sheet 18, the die 12 is placed on the conductor rods 20. Alignment of the bond pads 21 of the die 12 may be accomplished by the optical technique discussed above. After the die 12 has been properly aligned, a vacuum source (not shown) is applied to the passages 24, 26, 28, and 50 to seat the die 12. The vacuum should seat the die 12 sufficiently so that the entire assembly may be handled without the die 12 moving out of alignment.

FIG. 6 shows the package 38 and the contact integrator 10 following application of the vacuum but prior to complete integration. Following application of the vacuum source, a force distribution mechanism is applied to the package 38 to temporarily hold the contact integrator 10 in place, pending installation of the more permanent lid 40. In this embodiment, the force distribution mechanism consists of a temporary lid 52, a foam layer 54 to gently engage the die 12, and two C-clips 56 to hold the temporary lid 52 in place. Other conventional force distribution mechanisms may also be used.

To complete the integration of the contact integrator 10, the force distribution mechanism is removed and electrical connections between the contact integrator 10 and the leads 44 of the package 38 are established via a plurality of bonding wires 58. The bonding wires 58 are coupled between each trace 30 and a corresponding trace 60 that is coupled to the package body 46 and in ohmic contact with the leads 44. After the contact integrator 10 is disposed in the package 38, the lid 40 may be placed on the top of the package to enclose the cavity 48. The lid 40 may be temporarily attached to the package body 46 in the case of a testing mode, or the lid 40 may be permanently fixed to the test body 46 in the case of a permanent integration.

An alternate embodiment of a compliant contact integrator 10' is depicted in FIGS. 7 and 8, which show respectively, a pictorial of the compliant contact integrator 10' and a cross-sectional view of FIG. 7 taken at section 8—8. To the extent the same or similar elements from the previously described embodiment are used in this embodiment, like reference numerals will be used. This alternative embodiment of the compliant contact integrator 10' includes the relatively rigid dielectric substrate 14, the conductor rods 20, and the conductor traces 30 depicted in FIGS. 1–3. However, in this alternate embodiment, the insulating sheet 18 depicted in FIGS. 1–3 is eliminated from the final structure as shown in FIGS. 4 and 5. To afford the positional stability and vertical alignment that would ordinarily be facilitated by the placement of the insulating sheet 18, the conductor rods 20 are bonded to the Z-elastomer member 16a during the curing process. The Z-elastomer member 16a is composed of a two-stage Z-elastomer material that is deposited on the substrate 14 and exposed to a two-stage curing process. In the initial stage of the two-stage cure, a liquid phase Z-elastomer material is subjected to a low temperature cure of about 50 to 60° C. The rods 20 are then depressed into the Z-elastomer member 16a, and a higher temperature second curing stage of between about 130 and 500° C. is applied to set the Z-elastomer and bond the lower ends of the conductor rods 20 to the Z-elastomer member 16a. When the conductor rods 20 are depressed into the upper surface of the Z-elastomer member 16a subsequent to the first curing stage, dimples 64 will typically form in the upper surface of the Z-elastomer member 16a. The dimples 64 will typically survive the higher temperature curing process.

The Z-elastomer member 16a may be about 2 to 30 mils thick and is advantageously about 10 mils thick. Exemplary two-stage Z-elastomers are available from A.I. Technology, of Princeton N.J.

During the formation of the compliant contact integrator 10', an insulating sheet 18 of the type depicted in FIGS. 1–3, though without elastomeric bushings 32, is temporarily placed on the upper surface of the Z-elastomer member 16a subsequent to the initial curing step. The insulating sheet (not shown) provides the initial vertical and spatial alignment of the conductor rods 20. Subsequent to the higher temperature curing step, the insulating sheet (not shown) is removed, leaving the configuration shown in FIGS. 7 and 8. Although the term insulating sheet is used to describe the member used to provide the initial vertical and spatial alignment of the conductor rods 20 in this alternative embodiment, the skilled artisan will appreciate that the transient nature of the insulating sheet suggests that the types of materials used to form the insulating sheet spacer are not limited to dielectrics. Indeed, the insulating sheet may be formed from a conducting material, such as stainless steel. It is envisioned that the insulating sheet may be repeatedly used. Consequently, it is advantageous that the material used to form the insulating sheet have a low enough ductility such that the holes through which the conductor rods 20 are placed are not subject to rapid wear which might degrade the dimensional tolerances of the holes.

The skilled artisan will appreciate that the conductor rods 20 in the compliant contact integrator 10' provide the sole support of a die 12 placed thereon. Consequently, in this embodiment, the compliant contact integrator 10' uses a minimum of three conductor rods 20 spaced apart in a triangular arrangement. The number of conductor rods 20 will generally be a matter of discretion on the part of the designer.

In the assembly procedure for the compliant contact integrator 10', the substrate is placed in the cavity 48 of the package 38 shown in FIGS. 4–6, and the Z-elastomer member 16a is disposed on the substrate 14 using the aforementioned staged curing process. The remainder of the integration process is carried as described above.

An alternate embodiment of the compliant contact integrator 10" is depicted in FIG. 9. To the extent the same or similar elements from the previously described embodiment are used in this embodiment, like reference numerals will be used. The compliant contact integrator 10" includes a relatively rigid dielectric substrate 14, an insulating sheet 18, conductor rods 20, and elastomeric bushings 32 of the types described above. However, in this alternative embodiment, the Z-elastomer member 16 and the conductor traces 30 depicted in FIGS. 1–3 are replaced with a layer of insulating elastomer 66 disposed on the substrate 14, a layer of polymeric material 68 disposed on the insulating elastomer layer 66, and one or more metallic conductor traces 30a formed on the upper surface of the polymeric layer 68. The conducting path from the die 12 passes through the conductor rods 20 to the conductor traces 30a.

The insulating elastomer layer 66 is composed of a silicone or like elastomer, such as polyimide siloxane manufactured by Dow Chemical Co. or Rogers Corporation. To provide a conducting path to the conductor rods 20, the conductor traces 30a may be formed on the polymeric layer 68, as shown in FIG. 9, or directly on the upper surface of the insulating elastomer layer 66 without an intervening polymeric layer 68. In the former situation, the polymeric layer 68 is advantageously formed from polyimide or similar material that is usually in the form of a tape that may be attached to the insulating elastomer layer 66 with an adhesive, such as an epoxy. The conductor traces 30a may be formed on polymeric layer 68 using techniques described above in conjunction with the discussion of conventional bare die integration schemes.

The compliant contact integrator 10" is assembled using the same procedure described with regard to the embodiment depicted in FIGS. 1–3. When the compliant contact integrator 10" is assembled, the lower ends of the conductor rods 20 deform the conductor traces 30a as shown in FIG. 9. Compliant contact between the die 12 and the conductor rods 20 is provided by the insulating elastomer layer 66 and by the elastomeric bushings 32.

Although particular detailed embodiments have been described herein, it should be understood that the invention is not restricted to the details of the disclosed embodiments and that changes in design, configuration, and dimensions may be possible without departing from the spirit and scope of the invention as defined by the appended claims.

What is claimed:

1. A contact integrator for supporting a die in a semiconductor package and for providing an electrical pathway from said semiconductor package to a conducting region on said die, comprising:

a substrate having a conductor member coupled thereto, said conductor member being adapted to be electrically connected to said semiconductor package;

a Z-elastomer member disposed on said substrate; and three conductor rods coupled to said Z-elastomer member, each of said conductor rods having a first end for contacting and supporting said die and a second end coupled to said Z-elastomer member.

2. The contact integrator of claim 1, wherein said conductor rods are disposed in spaced apart relation such that said conductor rods substantially define an isosceles triangle pattern.

3. The contact integrator of claim 1, wherein said Z-elastomer member comprises a first passage extending therethrough and wherein said substrate comprises a second passage extending therethrough, said first and second passages being substantially aligned such that a force may be applied to said die to urge said die toward said Z-elastomer member.

4. A contact integrator for supporting a die in a semiconductor package and for providing an electrical pathway from said semiconductor package to a conducting region on said die, consisting essentially of:

a substrate having a conductor member coupled thereto, said conductor member being adapted to be electrically connected to said semiconductor package;

a Z-elastomer member disposed on said substrate;

an insulating member disposed on said Z-elastomer member; and a conductor rod coupled to said insulating member, said conductor rod having a first end adapted to contact said conducting region and a second end adapted to contact said Z-elastomer member, said conductor rod being substantially vertically aligned with said conducting region and said conductor member, and being capable of longitudinal movement relative to said insulating member.

5. The contact integrator of claim 4 further comprising an elastomeric bushing disposed around said conductor rod and coupled to said insulating member.

6. The contact integrator of claim 5, wherein said insulating member comprises an aperture, said bushing and said conductor rod being disposed in said aperture.

7. The contact integrator of claim 4, wherein said insulating member comprises a first passage extending therethrough and wherein, said Z-elastomer member comprises a second passage extending therethrough, and wherein said substrate comprises a third passage extending therethrough, said first, second, and third passages being substantially aligned such that a vacuum may be applied to said die to urge said die toward said insulating member.

8. A system for encasing a bare die, comprising:

a semiconductor package having a conducting pin extending therefrom and having an internal cavity;

a substrate disposed in said internal cavity, said substrate having a conductor member coupled thereto, said conductor member being adapted to be electrically connected to said semiconductor package;

a Z-elastomer member disposed on said substrate;

an insulating member disposed on said Z-elastomer member; and a conductor rod coupled to said insulating member, said conductor rod having a first end adapted to contact said conducting region and a second end adapted to contact said Z-elastomer member, said conductor rod being substantially vertically aligned with said conducting region and said conductor member, and being capable of longitudinal movement relative to said insulating member.

9. The contact integrator of claim 8 further comprising an elastomeric bushing disposed around said conductor rod and coupled to said insulating member.

10. The contact integrator of claim 9, wherein said insulating member comprises an aperture said bushing and said conductor rod being disposed in said aperture.

11. The contact integrator of claim 8, wherein said insulating member comprises a first passage extending therethrough, wherein said Z-elastomer member comprises a second passage extending therethrough, and wherein said substrate comprises a third passage extending therethrough, said first, second, and third passages being substantially aligned such that a vacuum may be applied to said die to urge said die toward said insulating member.

12. A contact integrator for supporting a die in a semiconductor package and for providing an electrical pathway from said semiconductor package to a conducting region on said die, comprising:

a substrate having a conductor member, said conductor member being adapted to be electrically connected to said semiconductor package;

a Z-elastomer member disposed on said substrate; and three conductor rods, each of said conductor rods having a first end for supporting said die and a second end contacting said Z-elastomer member.

13. The contact integrator of claim 12, wherein said conductor rods are disposed in spaced apart relation such that said conductor rods substantially define a triangle.

14. The contact integrator of claim 12, wherein said Z-elastomer member comprises a first passage extending therethrough and wherein said substrate comprises a second passage extending therethrough, said first and second passages being substantially aligned such that a force may be applied to said die to urge said die toward said Z-elastomer member.

15. A contact integrator for supporting a die in a semiconductor package and for providing an electrical pathway from said semiconductor package to a conducting region on said die, comprising:

a substrate having a conductor member coupled thereto, said conductor member being adapted to be electrically connected to said semiconductor package;

a Z-elastomer member disposed on said substrate;

an insulating member disposed on said Z-elastomer member; and a conductor rod slidably coupled through said insulating member, said conductor rod having a first end adapted to contact said conducting region on said die and a second end adapted to contact said Z-elastomer member, said conductor rod being substantially vertically aligned with said conducting region and said conductor member.

16. The contact integrator of claim 15 further comprising an elastomeric bushing disposed around said conductor rod and coupled to said insulating member.

17. The contact integrator of claim 15, wherein said insulating member comprises a first passage extending therethrough, wherein said Z-elastomer member comprises a second passage extending therethrough, and wherein said substrate comprises a third passage extending therethrough, said first, second, and third passages being substantially aligned such that a vacuum may be applied to said die to urge said die toward said insulating member.

18. A system for encasing a bare die, comprising:

a semiconductor package having a conducting pin extending therefrom and having an internal cavity;

a substrate disposed in said internal cavity, said substrate having a conductor member coupled thereto, said conductor member being adapted to be electrically connected to said conducting pin;

a Z-elastomer member disposed on said substrate and being electrically coupled to said conductor member;

an insulating member disposed on said Z-elastomer member;

a conductor rod extending through said insulating member, said conductor rod having a first end and a second end, said first end contacting said Z-elastomer; and a die having a conducting region, said die disposed on said insulating member with said conducting region contacting said second end of said conductor rod.

19. The contact integrator of claim 18 further comprising an elastomeric bushing disposed around said conductor rod and coupled to said insulating member.

20. The contact integrator of claim 18, wherein said insulating member comprises a first passage extending therethrough, wherein said Z-elastomer member comprises a second passage extending therethrough, and wherein said substrate comprises a third passage extending therethrough, said first, second, and third passages being substantially aligned such that a vacuum may be applied to said die to urge said die toward said insulating member.

21. A contact integrator for supporting a die in a semiconductor package and for providing an electrical pathway from said semiconductor package to a conducting region on said die, the contact integrator consisting of:

a substrate having a conductor member, said conductor member being adapted to be electrically connected to said semiconductor package;

a Z-elastomer member disposed on said substrate; and three conductor rods, each of said conductor rods having a first end for supporting said die and a second end contacting said Z-elastomer member.

22. The contact integrator of claim 21, wherein said conductor rods are disposed in spaced apart relation such that said conductor rods substantially define a triangle.

23. The contact integrator of claim 21, wherein said Z-elastomer member comprises a first passage extending therethrough and wherein said substrate comprises a second passage extending therethrough, said first and second passages being substantially aligned such that a force may be applied to said die to urge said die toward said Z-elastomer member.

24. A contact integrator for supporting a die in a semiconductor package and for providing an electrical pathway from said semiconductor package to a conducting region on said die, the contact integrator consisting of:

a substrate having a conductor member coupled thereto, said conductor member being adapted to be electrically connected to said semiconductor package;

a Z-elastomer member disposed on said substrate;

an insulating member disposed on said Z-elastomer member; and a conductor rod slidably coupled through said insulating member, said conductor rod having a first end adapted to contact said conducting region on said die and a second end adapted to contact said Z-elastomer member, said conductor rod being substantially vertically aligned with said conducting region and said conductor member.

25. The contact integrator of claim 24 further consisting of an elastomeric bushing disposed around said conductor rod and coupled to said insulating member.

26. The contact integrator of claim 24, wherein said insulating member comprises a first passage extending therethrough, wherein said Z-elastomer member comprises a second passage extending therethrough, and wherein said substrate comprises a third passage extending therethrough, said first, second, and third passages being substantially aligned such that a vacuum may be applied to said die to urge said die toward said insulating member.

27. A system for encasing a bare die, the system consisting essentially of:

a semiconductor package having a conducting pin extending therefrom and having an internal cavity;

a substrate disposed in said internal cavity, said substrate having a conductor member coupled thereto, said conductor member being adapted to be electrically connected to said conducting pin;

a Z-elastomer member disposed on said substrate and being electrically coupled to said conductor member;

an insulating member disposed on said Z-elastomer member;

a conductor rod extending through said insulating member, said conductor rod having a first end and a second end, said first end contacting said Z-elastomer; and a die having a conducting region, said die disposed on said insulating member with said conducting region contacting said second end of said conductor rod.

28. The contact integrator of claim 27 further comprising an elastomeric bushing disposed around said conductor rod and coupled to said insulating member.

29. The contact integrator of claim 27, wherein said insulating member comprises a first passage extending therethrough, wherein said Z-elastomer member comprises a second passage extending therethrough, and wherein said substrate comprises a third passage extending therethrough, said first, second, and third passages being substantially aligned such that a vacuum may be applied to said die to urge said die toward said insulating member.

* * * * *